US009818625B2

(12) United States Patent
Li et al.

(10) Patent No.: US 9,818,625 B2
(45) Date of Patent: Nov. 14, 2017

(54) STACKED SEMICONDUCTOR DIE ASSEMBLIES WITH THERMAL SPACERS AND ASSOCIATED SYSTEMS AND METHODS

(71) Applicant: Micron Technology, Inc., Boise, ID (US)

(72) Inventors: Jian Li, Boise, ID (US); Steven K. Groothuis, Boise, ID (US); Michel Koopmans, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/059,076

(22) Filed: Mar. 2, 2016

(65) Prior Publication Data
US 2016/0181125 A1 Jun. 23, 2016

Related U.S. Application Data

(62) Division of application No. 14/105,940, filed on Dec. 13, 2013, now Pat. No. 9,287,240.

(51) Int. Cl.
*H01L 21/48* (2006.01)
*H01L 23/42* (2006.01)
(Continued)

(52) U.S. Cl.
CPC ........ *H01L 21/4882* (2013.01); *H01L 21/563* (2013.01); *H01L 23/36* (2013.01); *H01L 23/3731* (2013.01); *H01L 23/3738* (2013.01); *H01L 23/42* (2013.01); *H01L 23/4334* (2013.01); *H01L 23/5385* (2013.01); *H01L 24/09* (2013.01); *H01L 24/81* (2013.01); *H01L 25/0657* (2013.01); *H01L 25/50* (2013.01); *H01L 23/3128* (2013.01);
(Continued)

(58) Field of Classification Search
CPC ... H01L 21/4882; H01L 21/563; H01L 25/50; H01L 24/09; H01L 24/81; H01L 23/42; H01L 23/3758; H01L 23/36; H01L 2924/1431; H01L 2924/437; H01L 2924/1436; H01L 2224/16257; H01L 2224/16146
See application file for complete search history.

(56) References Cited

U.S. PATENT DOCUMENTS

| 5,397,747 A | 3/1995 | Angiulli et al. |
| 2008/0108179 A1* | 5/2008 | Mistry ............... H01L 21/561 438/117 |

(Continued)

*Primary Examiner* — Peniel M Gumedzoe
(74) *Attorney, Agent, or Firm* — Perkins Coie LLP (57) ABSTRACT

Stacked semiconductor die assemblies with thermal spacers and associated systems and methods are disclosed herein. In one embodiment, a semiconductor die assembly can include a thermally conductive casing defining a cavity, a stack of first semiconductor dies within the cavity, and a second semiconductor die stacked relative to the stack of first dies and carried by a package substrate. The semiconductor die assembly further includes a thermal spacer disposed between the package substrate and the thermally conductive casing. The thermal spacer can include a semiconductor substrate and plurality of conductive vias extending through the semiconductor substrate and electrically coupled to the stack of first semiconductor dies, the second semiconductor die, and the package substrate.

18 Claims, 7 Drawing Sheets

(51) Int. Cl.
  *H01L 21/56* (2006.01)
  *H01L 23/373* (2006.01)
  *H01L 25/00* (2006.01)
  *H01L 23/00* (2006.01)
  *H01L 25/065* (2006.01)
  *H01L 23/36* (2006.01)
  *H01L 23/433* (2006.01)
  *H01L 23/538* (2006.01)
  H01L 23/31 (2006.01)
  H01L 23/427 (2006.01)
  H01L 23/498 (2006.01)

(52) U.S. Cl.
  CPC .... *H01L 23/4275* (2013.01); *H01L 23/49827* (2013.01); *H01L 2224/16145* (2013.01); *H01L 2224/16146* (2013.01); *H01L 2224/16225* (2013.01); *H01L 2224/16257* (2013.01); *H01L 2924/1431* (2013.01); *H01L 2924/1436* (2013.01); *H01L 2924/1437* (2013.01); *H01L 2924/15311* (2013.01)

(56) References Cited

U.S. PATENT DOCUMENTS

| | | | |
|---|---|---|---|
| 2008/0203554 A1 | 8/2008 | Nishio et al. | |
| 2012/0007229 A1 | 1/2012 | Bartley et al. | |
| 2012/0119346 A1* | 5/2012 | Im | H01L 21/563 257/690 |
| 2013/0119528 A1 | 5/2013 | Groothuis et al. | |
| 2013/0141858 A1 | 6/2013 | Pyeon et al. | |
| 2013/0214396 A1* | 8/2013 | Kim | H01L 25/105 257/659 |
| 2015/0170991 A1 | 6/2015 | Koopmans et al. | |

* cited by examiner

STACKED SEMICONDUCTOR DIE ASSEMBLIES WITH THERMAL SPACERS AND ASSOCIATED SYSTEMS AND METHODS

CROSS-REFERENCE TO RELATED APPLICATION

This application is a divisional of U.S. application Ser. No. 14/105,940 filed Dec. 13, 2013, which is incorporated herein by reference in its entirety.

TECHNICAL FIELD

The disclosed embodiments relate to semiconductor die assemblies and to managing heat within such assemblies. In particular, the present technology relates to stacked semiconductor device assemblies with thermal spacers and associated systems and methods.

BACKGROUND

Packaged semiconductor dies, including memory chips, microprocessor chips, and imager chips, typically include a semiconductor die mounted on a substrate and encased in a plastic protective covering. The die includes functional features, such as memory cells, processor circuits, and imager devices, as well as bond pads electrically connected to the functional features. The bond pads can be electrically connected to terminals outside the protective covering to allow the die to be connected to higher level circuitry.

Market pressures continually drive semiconductor manufacturers to reduce the size of die packages to fit within the space constraints of electronic devices, while also pressuring them to increase the functional capacity of each package to meet operating parameters. One approach for increasing the processing power of a semiconductor package without substantially increasing the surface area covered by the package (i.e., the package's "footprint") is to vertically stack multiple semiconductor dies on top of one another in a single package. The dies in such vertically-stacked packages can be interconnected by electrically coupling the bond pads of the individual dies with the bond pads of adjacent dies using through-silicon vias (TSVs).

A challenge associated with vertically stacked die packages is that the heat generated by the individual dies combines and increases the operating temperatures of the individual dies, the junctions therebetween, and the package as a whole. This can cause the stacked dies to reach temperatures above their maximum operating temperatures ($T_{max}$) in many types of devices and especially as the density of the dies in the package increases.

DETAILED DESCRIPTION

Specific details of several embodiments of stacked semiconductor die assemblies with a thermal spacer configured to distribute heat and associated systems and methods are described below. The term "semiconductor die" generally refers to a die having integrated circuits or components, data storage elements, processing components, and/or other features manufactured on semiconductor substrates. For example, semiconductor dies can include integrated circuit memory and/or logic circuitry. Semiconductor dies and/or other features in semiconductor die packages can be said to be in "thermal contact" with one another if the two structures can exchange energy through heat. A person skilled in the relevant art will also understand that the technology may have additional embodiments, and that the technology may be practiced without several of the details of the embodiments described below with reference to FIGS. 1-7.

As used herein, the terms "vertical," "lateral," "upper" and "lower" can refer to relative directions or positions of features in the semiconductor die assemblies in view of the orientation shown in the Figures. For example, "upper" or "uppermost" can refer to a feature positioned closer to the top of a page than another feature. These terms, however, should be construed broadly to include semiconductor devices having other orientations.

Figure 1:
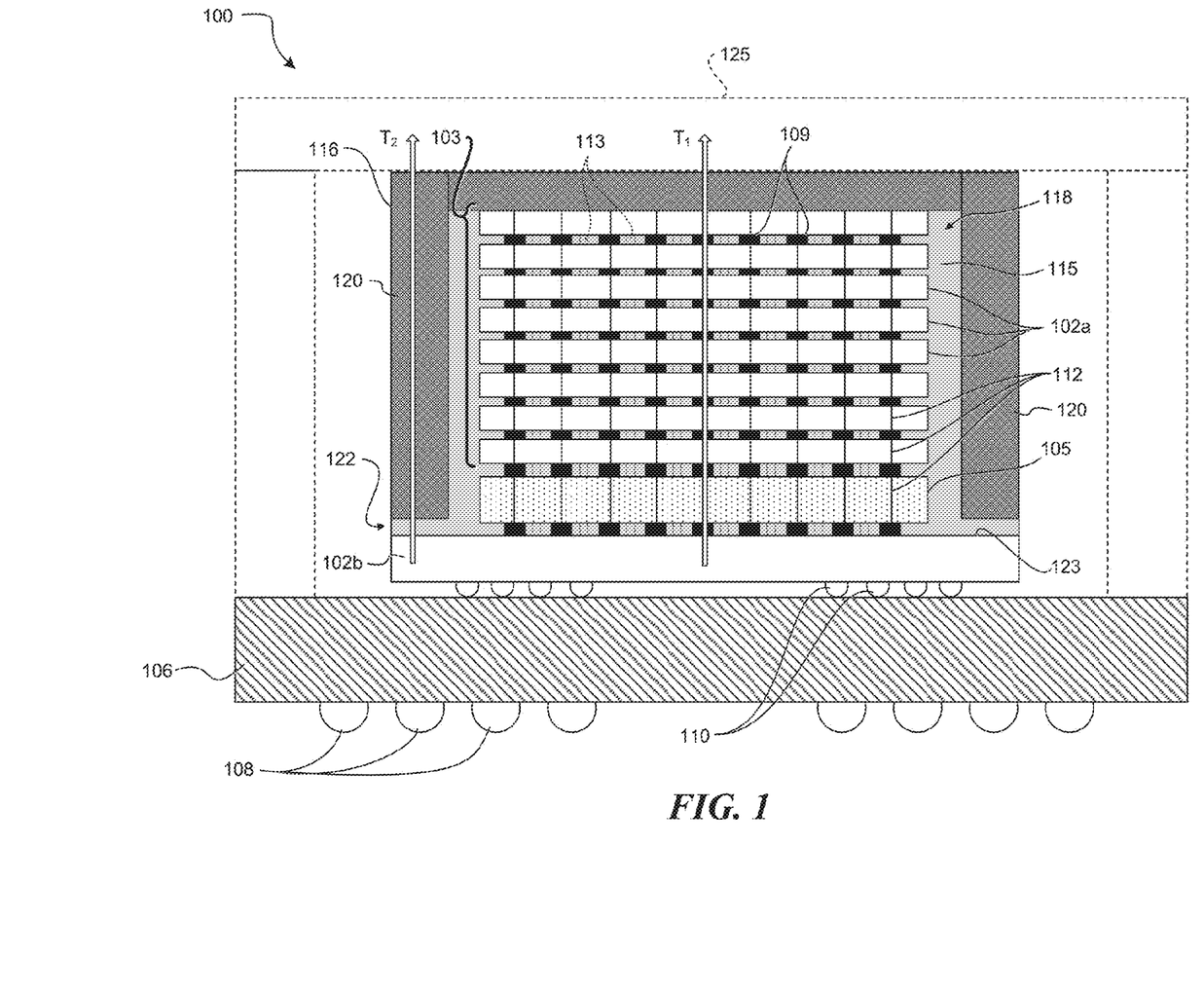
FIG. 1 is a cross-sectional view of a semiconductor die assembly configured in accordance with an embodiment of the present technology.

FIG. 1 is a cross-sectional view of a semiconductor die assembly 100 ("assembly 100") configured in accordance with an embodiment of the present technology. As shown, the assembly 100 includes a plurality of first semiconductor dies 102a ("first dies 102a") arranged in a stack 103 on a thermal spacer 105 carried by a second semiconductor die 102b ("second die 102b") and a package substrate 106. The package substrate 106 can include, for example, an interposer, printed circuit board, or other suitable substrate having electrical connectors 108 (e.g., metal bumps) that connect the assembly 100 to external circuitry (not shown).

The first and second dies 102a and 102b (collectively referred to as "dies 102") can include various types of semiconductor components and functional features, such as dynamic random-access memory (DRAM), static random-access memory (SRAM), flash memory, other forms of integrated circuit ("IC") devices, including memory, processing circuits, imaging components, and/or other semiconductor devices. In various embodiments, for example, the assembly 100 can be configured as a hybrid memory cube (HMC) in which the stacked first dies 102a are DRAM dies or other memory dies that provide data storage and the second semiconductor die 102b is a high-speed logic die that provides memory control (e.g., DRAM control) within the HMC. In other embodiments, the dies 102 may include other semiconductor components and/or the semiconductor components of the individual first dies 102a in the stack 103 may differ. Further, although the stack 103 shown in FIG. 1 includes eight first dies 102a, in other embodiments the stack 103 can include fewer than eight dies (e.g., three dies, four dies, etc.) or more than eight dies (e.g., ten dies, twelve dies, etc.).

As shown in FIG. 1, the dies 102 can be electrically coupled to one another and the thermal spacer 105 by a plurality of electrically conductive elements 109 disposed therebetween. The electrically conductive elements 109 can have various suitable structures, such as pillars, columns, studs, bumps, and can be made from copper, nickel, solder (e.g., SnAg-based solder), conductor-filled epoxy, and/or other electrically conductive materials. In selected embodiments, for example, the electrically conductive elements 109 can be copper pillars, whereas in other embodiments the electrically conductive elements 109 can include more complex structures, such as bump-on-nitride structures. In the illustrated embodiment of FIG. 1, the second die 102b is electrically coupled to the package substrate 106 by a plurality of electrical connectors 110 (e.g., metal bumps). In certain embodiments, the electrical connectors 110 can be similar in structure and composition to the electrically conductive elements 109 (e.g., copper pillars).

The first dies 102a and the thermal spacer 105 each include a plurality of vias 112 (e.g., TSVs). The vias 112 are aligned on one or both sides with corresponding electrically conductive elements 109. Beyond electrical communication, the electrically conductive elements 109 can serve as thermal conduits through which heat can be transferred away from the dies 102 (as shown, e.g., by first arrow $T_1$). In some embodiments, the assembly 100 can also include a plurality of thermally conductive elements 113 (shown in broken lines) positioned interstitially between the electrically conductive elements 109. The individual thermally conductive elements 113 can be at least generally similar in structure and composition as that of the electrically conductive elements 109 (e.g., copper pillars). However, the thermally conductive elements 113 are not electrically coupled to the dies 102 nor the thermal spacer 105. Instead, the thermally conductive elements 113 can serve as additional thermal conduits through which thermal energy can be transferred away from the dies 102, thereby facilitating additional heat transfer.

The dies 102 and the thermal spacer 105 can be at least partially encapsulated in a dielectric underfill material 115. The underfill material 115 can be deposited or otherwise formed around and/or between the dies 102 and the thermal spacer 105 to electrically isolate the electrically conductive elements 109 and/or enhance the mechanical connection between the dies 102 and the thermal spacer 105. The underfill material 115 can be a non-conductive epoxy paste (e.g., XS8448-171 manufactured by Namics Corporation of Niigata, Japan), a capillary underfill, a non-conductive film, a molded underfill, and/or include other suitable electrically-insulative materials. In some embodiments, the underfill material 115 can be selected based on its thermal conductivity to enhance heat dissipation through the dies 102 and/or the thermal spacer 105.

The thermal spacer 105 can include crystalline, semi-crystalline, and/or ceramic substrate materials, such as silicon, polysilicon, aluminum oxide ($Al_2O_3$), sapphire, and/or other suitable semiconductor materials having high thermal conductivities. The thermal spacer 105, for example, can be an interposer (e.g., a glass or silicon interposer) having passive, active, and/or inactive through-silicon vias. In certain embodiments, the thermal spacer 105 can be similar in shape, size, and/or composition as the second die 102b or the individual first dies 102a. For example, the thermal spacer 105 and the first dies 102a can each include a silicon substrate having the same arrangement of contact features (not shown) and/or type of contact features (e.g., bond pads) on each side of the substrate. In the illustrated embodiment of FIG. 1, the thermal spacer 105 and the stack 103 have the same footprint (i.e., the same planform shape). In other embodiments, the thermal spacer 105 and the stack 103 can have different footprints. For example, the thermal spacer 105 can be larger than the individual first dies 102a along at least one axis. As described in greater detail below, the thermal spacer 105 can also be configured to have the same footprint as the second die 102b and/or the package substrate 106.

In one aspect of the embodiment of FIG. 1, the thermal spacer 105 is configured to separate the stack 103 from the second die 102b to reduce the concentration of heat at the junction between the stack 103 and the second die 102b. In another aspect of the embodiment of FIG. 1, the thermal spacer 105 is configured to absorb and conduct thermal energy away from the dies 102. In several embodiments, the thermal spacer 105 can transfer heat such that the individual dies 102 operate at lower heat than without the thermal spacer 105. Further, the thermal spacer 105 can lower the operating temperatures of the individual dies 102 such that they stay below their designated maximum temperatures ($T_{max}$). When arranged as a HMC, a larger underlying logic die (e.g., the second die 102b) typically operates at a much higher power level than the stack of memory dies (e.g., the stack 103) above the logic die (e.g., 5.24 W compared to 0.628 W). The logic die, accordingly, radiates a significant amount of heat. The logic die may also have a higher power density toward its periphery that results in a further concentration of heat and temperature rise toward the periphery. In the illustrated embodiment, the thermal spacer 105 does not include IC devices nor other active components, such as memory and logic circuitry. As such, the thermal spacer 105 does not provide any intermediary signal processing (e.g., logic operations, switching, etc.). Instead, the thermal spacer 105 can be configured as a "blank die" or a "blank semi-conductor substrate" having only passive electrical conductors (e.g., the vias 112 and/or thermally conductive elements 113) for communicating electrical signals through the substrate of the thermal spacer 105, but without processing any of the signals communicated through the thermal spacer. Because such passive components do not collectively generate as much heat as IC devices or other active components, the thermal spacer 105 produces substantially smaller amounts of heat relative to the dies 102. In certain embodiments, the thermal spacer 105 can have a thickness configured to provide a suitable thermal spacing between the stack 103 and the second die 102b. Accordingly, in several embodiments the thermal spacer 105 can have the same thickness as either the second die 102b or the individual first dies 102a. In other embodiments, the thermal spacer 105 can be thicker or thinner than the dies 102.

The assembly 100 further includes a thermally conductive casing 116 ("casing 116") defining an enclosure 118 (e.g., a cavity, recess, etc.). The casing 116 includes an outer wall 120 extending at least partially around the stack 103. The casing 116 is attached to the second die 102b by a portion of the underfill material 115 in a gap 122 between the outer wall 120 and the second die 102b. In particular, the underfill material 115 in the gap 122 is attached to a forward facing surface 123 toward the periphery of the second die 102b. The casing 116 can serve as a heat spreader to absorb and dissipate thermal energy away from dies 102 and the thermal spacer 105. The casing 116 can accordingly be made from a thermally conductive material, such as nickel, copper, aluminum, ceramic materials with high thermal conductivities (e.g., aluminum nitride), and/or other suitable thermally conductive materials. In certain embodiments, the casing 116 may be at least partially contained within an outer casing 125 (shown in broken lines) attached to the package substrate 106 and further facilitating absorption and dissipation of thermal energy. In other embodiments, the casing 116 can include other configurations and/or structures, such as a heat sink (not shown) with a plurality of fins and/or other surface enhancing structures for enhanced heat dissipation.

In certain embodiments, the underfill material 115 in the gap 122 can enhance the thermal conductance at the junction between the outer wall 120 and the second die 102b (as shown, e.g., by second arrow $T_2$). In such a configuration, for example, the outer wall 120 can transfer heat away from the (often higher power density) peripheral portion of the second die 102b. In other embodiments, another interface material can be used in combination with or in lieu of the underfill material 115 to attach the outer wall 120 to the second die 102b. Other interface materials can include, for example, a silicone-based grease, gel, or adhesive that is doped with conductive materials (e.g., carbon nano-tubes, solder materials, diamond-like carbon (DLC), etc.), a phase-change material, as well as other suitable thermal interface materials (referred to in the art as a "TIMs"). In some embodiments, for example, an interface material can be made from X-23-7772-4 TIM manufactured by Shin-Etsu MicroSi, Inc. of Phoenix, Ariz., which has a thermal conductivity of about 3-4 W/m° K. In other embodiments, the interface material can be made from metals (e.g., copper) and/or other suitable thermally conductive materials.

Figure 2:
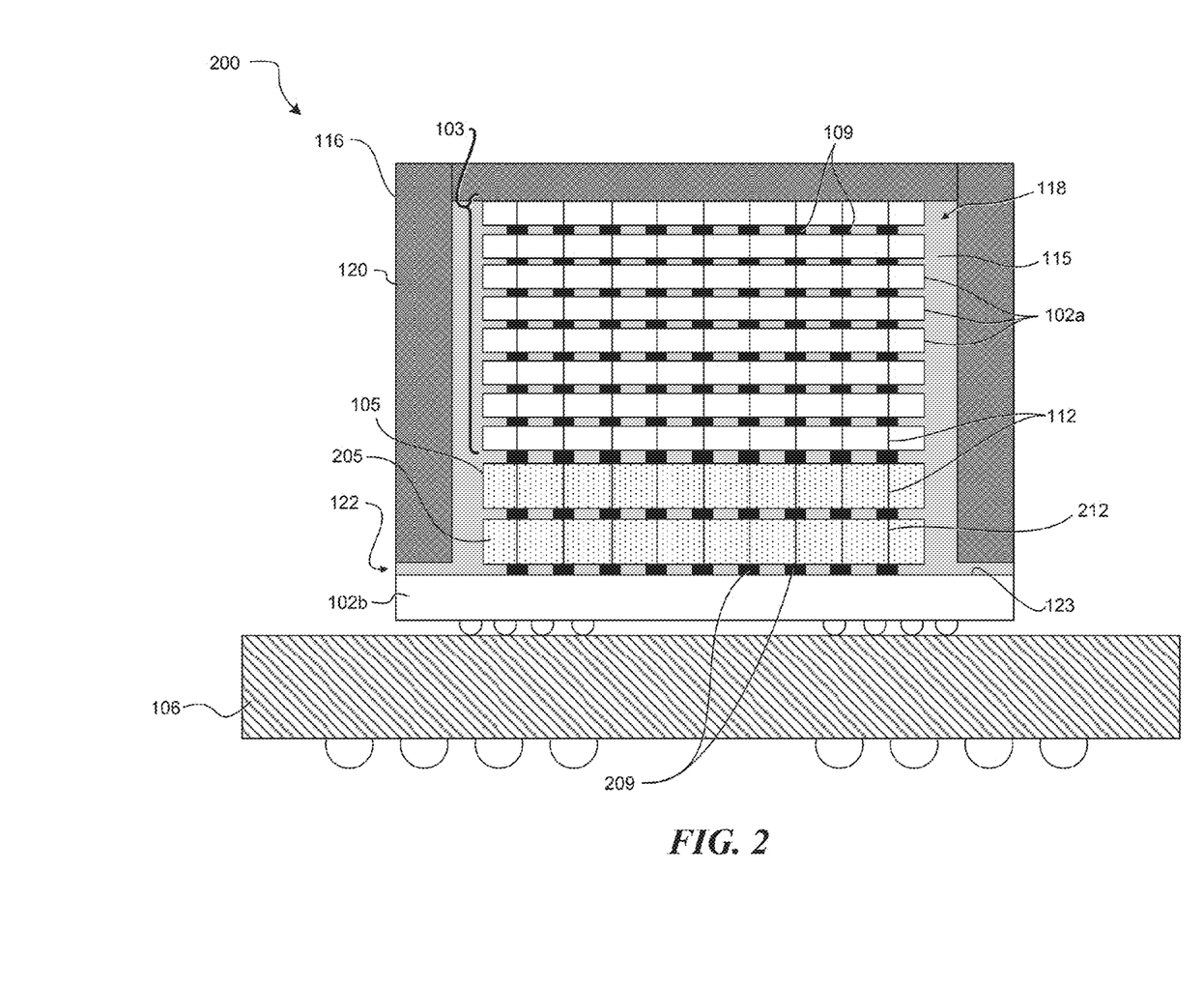
FIG. 2 is a cross-sectional view of a semiconductor die assembly configured in accordance with another embodiments of the present technology.

FIG. 2 is a partially schematic cross-sectional view of a semiconductor die assembly 200 ("assembly 200") configured in accordance with another embodiment of the present technology. The assembly 200 can include features generally similar to those of the assembly 100 of FIG. 1. For example, the assembly 200 includes the dies 102 and the thermal spacer 105 stacked relative to one another and interconnected by the vias 112 and the electrically conductive elements 109. The assembly 200 also includes an additional thermal spacer 205 disposed between the thermal spacer 105 and the second die 102b. The additional thermal spacer 205 can be similar to the thermal spacer 105 and can include, for example, vias 212 (e.g., TSVs) and electrically conductive elements 209 (e.g., copper pillars) electrically coupling the thermal spacer 105 with the second die 102b. In one aspect of the embodiment of FIG. 2, the additional thermal spacer 205 can provide additional separation between the second die 102b and the stack 103. As discussed above, additional separation can reduce the concentration of thermal energy between the stack 103 and the second die 102b.

Figure 3:
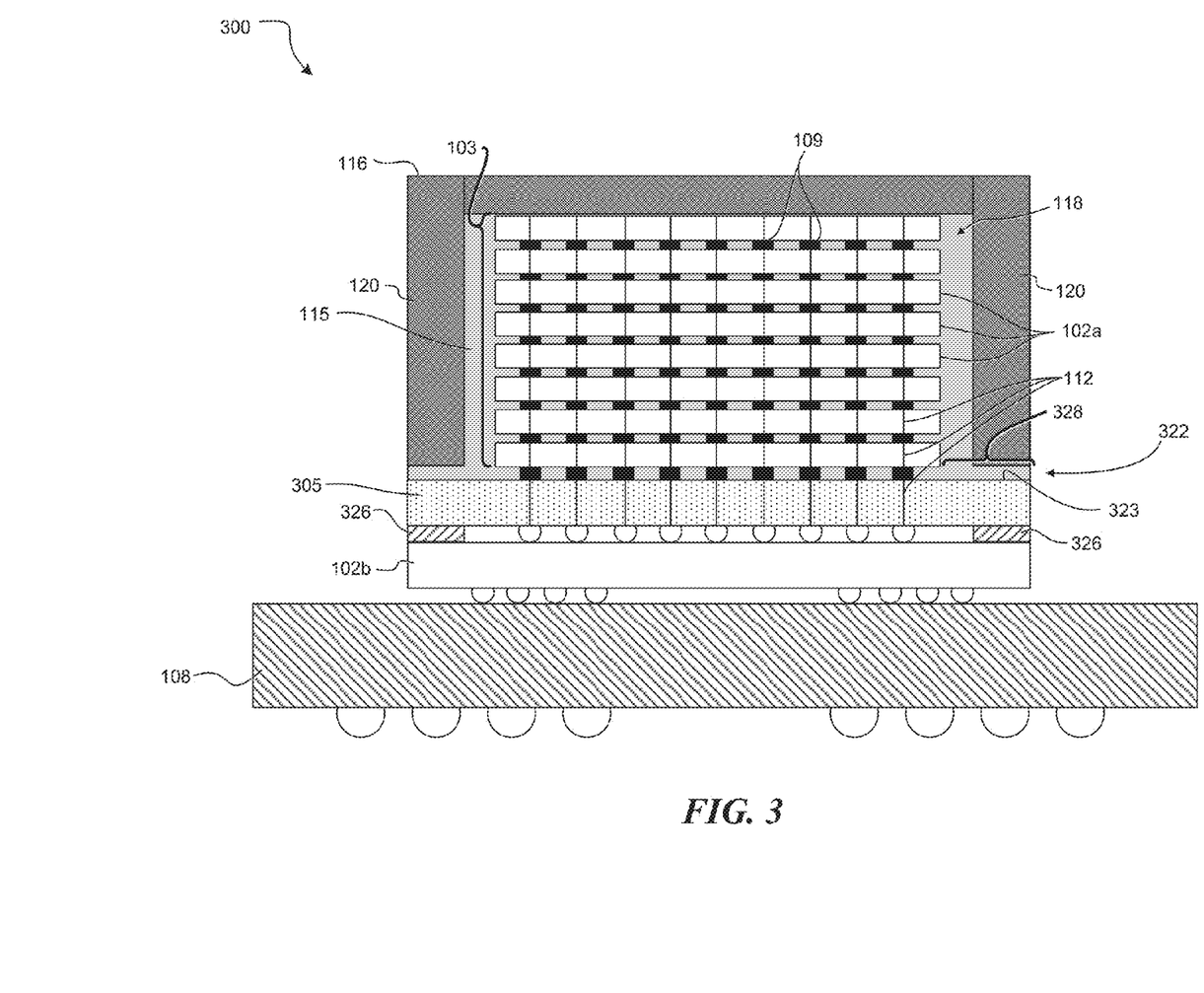
FIG. 3 is a cross-sectional view of a semiconductor die assembly configured in accordance with yet another embodiment of the present technology.

FIG. 3 is a cross-sectional view of a semiconductor die assembly 300 ("assembly 300") configured in accordance with yet another embodiment of the present technology. The assembly 300 can include features generally similar to the features of the assembly 100 described above with reference to FIG. 1. For example, the assembly 300 can include the dies 102 and a thermal spacer 305 stacked relative to the dies 102. In the illustrated embodiment of FIG. 3, the thermal spacer 305 has the same footprint of the second die 102b along at least one axis. In addition, the assembly 300 further includes an interface material 326 (e.g., a TIM) disposed between the second die 102b and the thermal spacer 305. The interface material 326 can be configured, for example, to enhance thermal contact as well as the mechanical connection between the second die 102b and the thermal spacer 305.

As shown, the thermal spacer 305 includes a peripheral portion 328 having a forward facing surface 323 attached to the outer wall 120 of the casing 116 via the underfill material 115 in a gap 322 between the outer wall 120 and the thermal spacer 305. The peripheral portion 328 can extend laterally outward beyond at least one side of the stack 103 (e.g., beyond the length and/or width of the stack 103). In general, the peripheral portion 328 can be defined by the position of the stack 103 on the underlying thermal spacer 305 and the relative dimensions of the stack 103 and the thermal spacer 305. As shown, the stack 103 and the thermal spacer 305 are centered with respect to one another such that the peripheral portion 328 extends laterally beyond opposite sides of the stack 103. In other embodiments, the stack 103 may be offset with respect to the center of the thermal spacer 305. As such, the peripheral portion 328 may extend around less than the full perimeter of the stack 103 and/or the peripheral portion 328 can have a larger footprint at one side of the stack 103 (e.g., the right side) relative to another side of the stack 103 (e.g., the left side). In one aspect of this embodiment, the thermal spacer 305 can facilitate manufacturing in addition to enhancing thermal properties. For example, the forward facing surface 323 of the thermal spacer 305 can provide a generally rigid attachment location for the casing 116. Further, the thermal spacer 305 can protect the underlying second die 102b during assembly.

Figure 4:
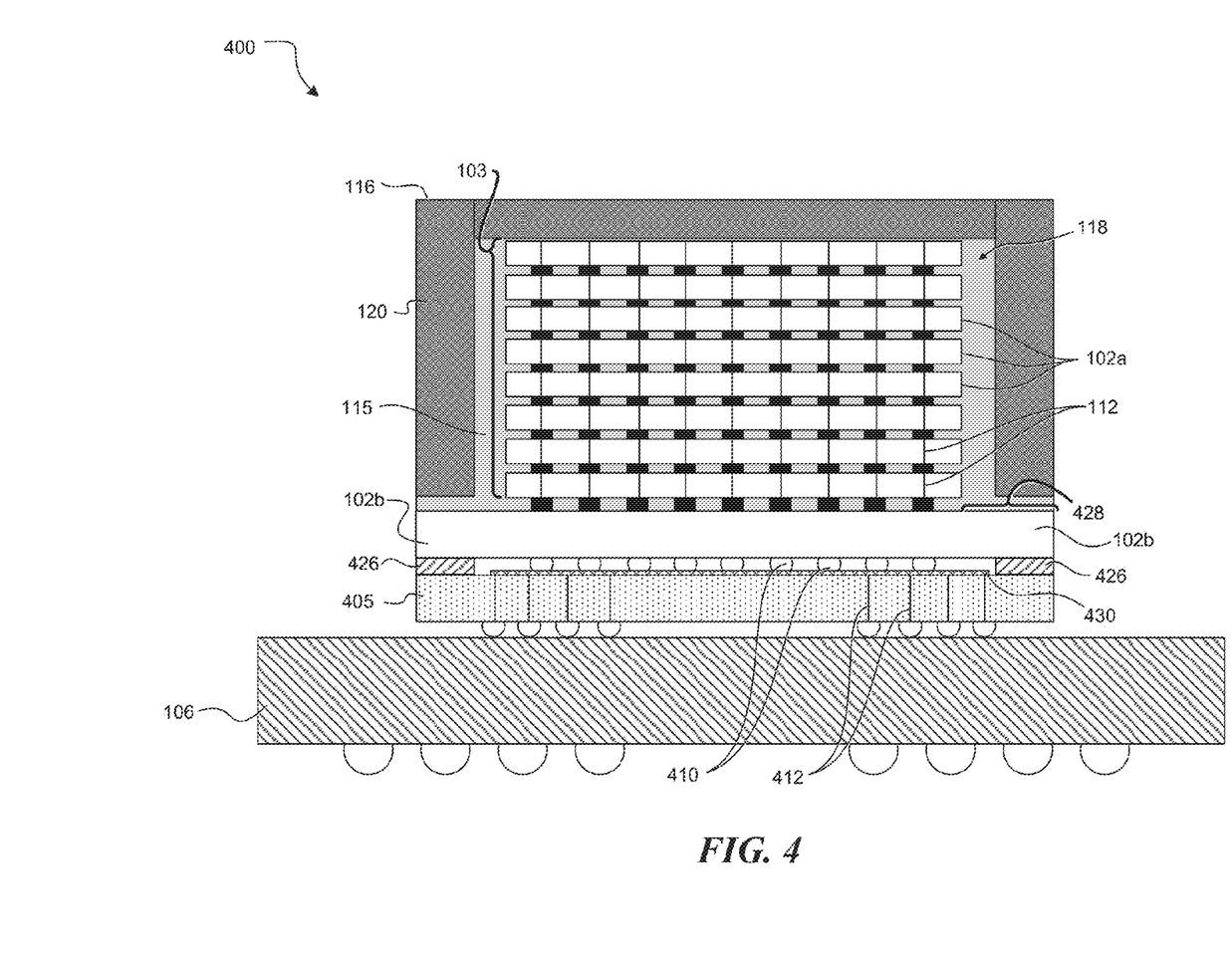
FIG. 4 is a partially schematic cross-sectional view of a semiconductor die assembly configured in accordance with a further embodiment of the present technology.

FIG. 4 is a partially schematic cross-sectional view of a semiconductor die assembly 400 ("assembly 400") configured in accordance with a further embodiment of the present technology. The assembly 400 can include, for example, features generally similar to the features of the assembly 100 described above with reference to FIG. 1. For example, the assembly 400 can include the dies 102 and a thermal spacer 405 stacked relative to the dies 102. Instead of being between the stack 103 and the second die 102b, however, the casing 116 is attached to a peripheral portion 428 of the second die 102b and the thermal spacer 405 is between the second die 102b and the package substrate 106. As shown, the thermal spacer 405 includes a plurality of vias 412 electrically coupled to a redistribution structure 430. The redistribution structure 430 can include conductive features (not shown), such as traces, metal lines, bond pads, etc., that electrically couple the vias 412 to electrical connectors 410 of the second die 102b. In one aspect of the embodiment of FIG. 4, the thermal spacer 405 can absorb and dissipate heat at the junction between the second die 102b and the package substrate 106. In addition, an interface material 426 (e.g., a TIM) disposed between the second die 102b and the thermal spacer 405 can enhance heat transfer between the second die 102b and the thermal spacer 405.

Figure 5:
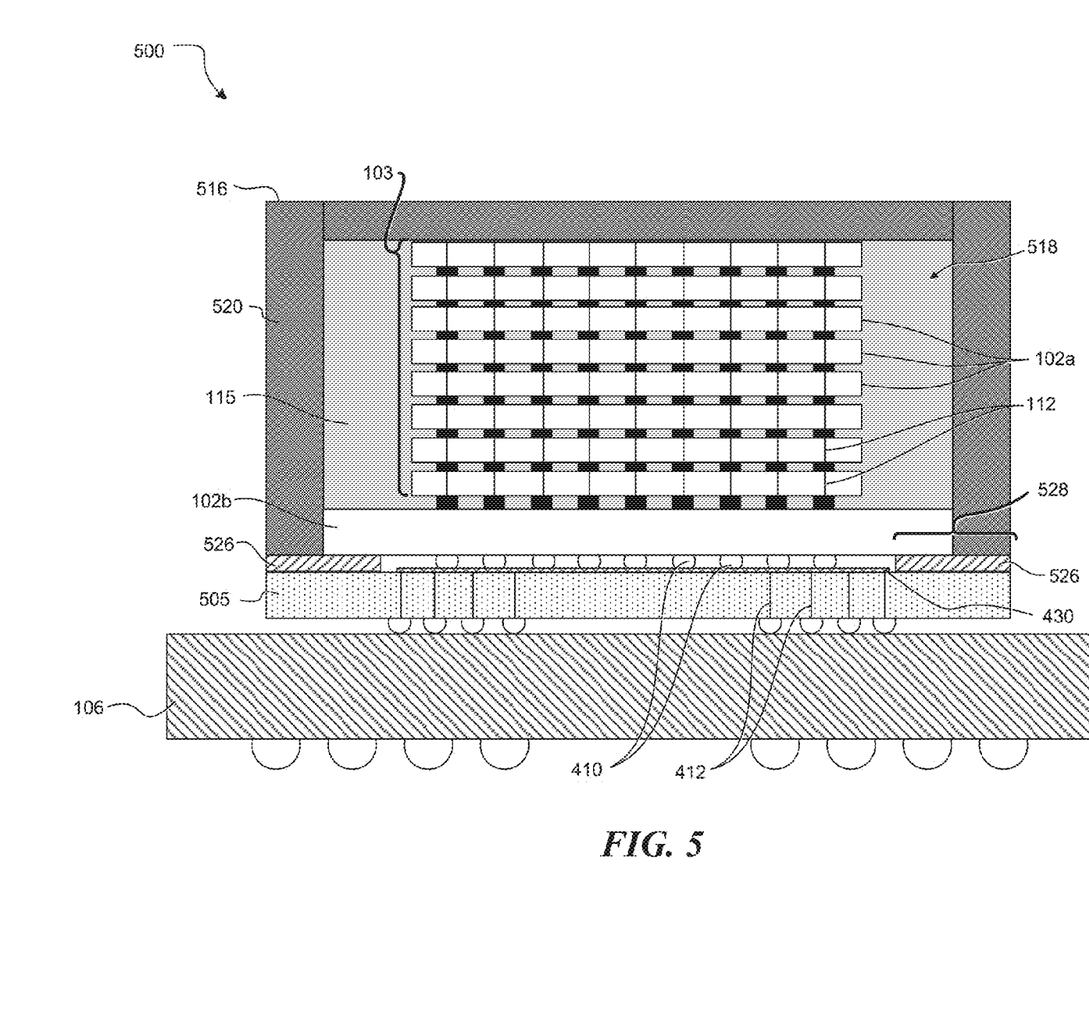
FIG. 5 is a partially schematic cross-sectional view of a semiconductor die assembly configured in accordance with a still further embodiment of the present technology.

FIG. 5 is a partially schematic cross-sectional view of a semiconductor die assembly 500 ("assembly 500") configured in accordance with a still further embodiment of the present technology. The assembly 500 can include features generally similar to the features described above with reference to FIGS. 1-4. For example, similar to the assembly 400 of FIG. 4, the assembly 500 includes a thermal spacer 505 between the second die 102b and the package substrate 106 and electrically coupled to the second die 102b by the electrical connectors 410 and the vias 412. However, the assembly 500 includes a configuration in which a thermally conductive casing 516 ("casing 516") at least partially encloses the second die 102b within an enclosure 518 of the casing 516. In addition, the thermal spacer 505 has a larger footprint than the second die 102b along at least one axis such that an outer wall 520 of the casing 516 can be connected to a peripheral portion 528 of the thermal spacer 505 by an interface material 526 (e.g., a TIM). In some embodiments, an interface material 526 can be positioned between the second die 102b and the outer wall 520 to enhance thermal contact with the thermal spacer 505.

Figure 6:
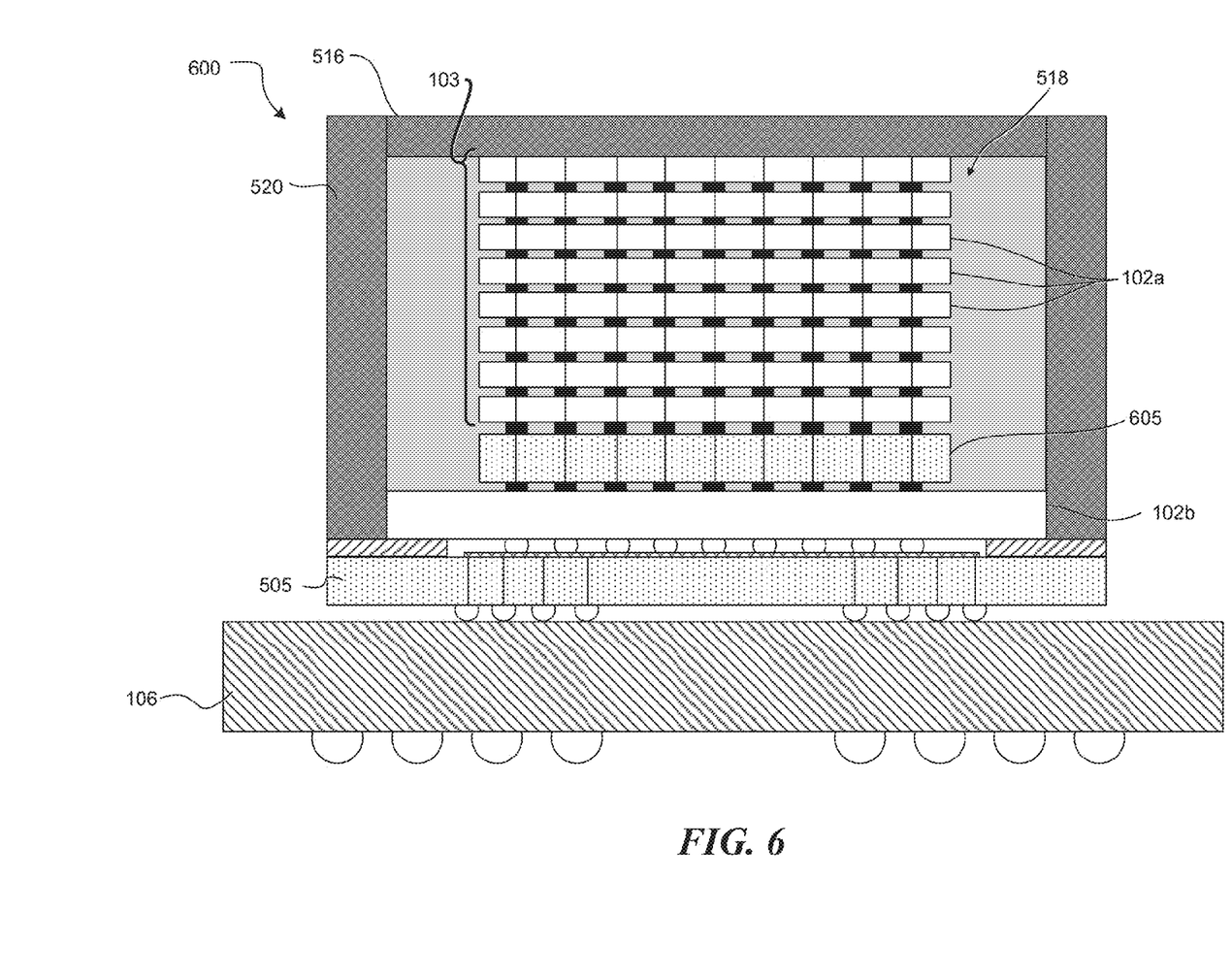
FIG. 6 is a partially schematic cross-sectional view of a semiconductor die assembly configured in accordance with another embodiment of the present technology.

FIG. 6 is a partially schematic cross-sectional view of a semiconductor die assembly 600 ("assembly 600") configured in accordance with another embodiment of the present technology. The assembly 600 can include features generally similar to those of the assembly 500 of FIG. 5. For example, the assembly 600 includes the thermally conductive casing 516 at least partially enclosing the dies 102 within the cavity 518 of the casing. The assembly 600 further includes an additional thermal spacer 605 between the second die 102b and the stack 103. Accordingly, in this configuration the thermal spacers 505, 605 can absorb and conduct heat away from opposite sides of the second die 102b.

Figure 7:
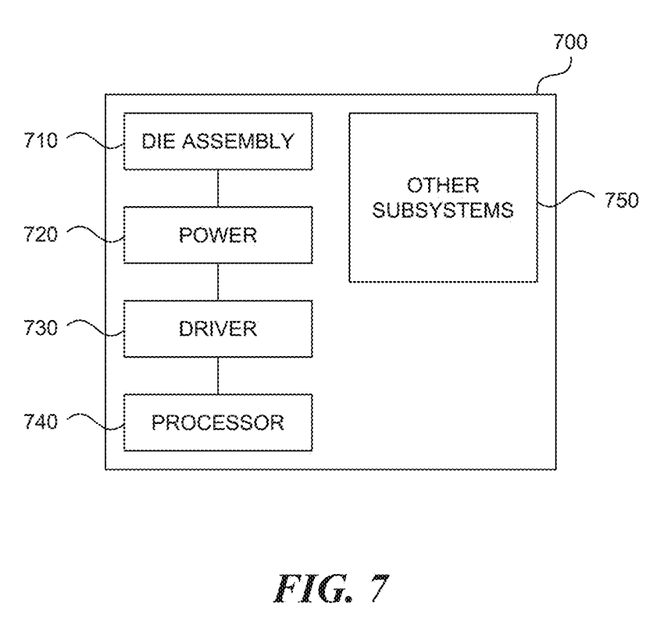
FIG. 7 is a schematic view of a system that includes a semiconductor die assembly configured in accordance with embodiments of the present technology.

Any one of the stacked semiconductor die assemblies described above with reference to FIGS. 1-6 can be incorporated into any of a myriad of larger and/or more complex systems, a representative example of which is system 700 shown schematically in FIG. 7. The system 700 can include a semiconductor die assembly 710, a power source 720, a driver 730, a processor 740, and/or other subsystems or components 750. The semiconductor die assembly 710 can include features generally similar to those of the stacked semiconductor die assemblies described above, and can therefore include multiple thermal paths that enhance heat dissipation. The resulting system 700 can perform any of a wide variety of functions, such as memory storage, data processing, and/or other suitable functions. Accordingly, representative systems 700 can include, without limitation, hand-held devices (e.g., mobile phones, tablets, digital readers, and digital audio players), computers, and appliances. Components of the system 700 may be housed in a single unit or distributed over multiple, interconnected units (e.g., through a communications network). The components of the system 700 can also include remote devices and any of a wide variety of computer readable media.

From the foregoing, it will be appreciated that specific embodiments of the technology have been described herein for purposes of illustration, but that various modifications may be made without deviating from the disclosure. For example, although many of the embodiments of the semiconductor dies assemblies are described with respect to HMCs, in other embodiments the semiconductor die assemblies can be configured as other memory devices or other types of stacked die assemblies. In addition, the semiconductor die assemblies illustrated in FIGS. 1-6 include a plurality of first semiconductor dies arranged in a stack on the second semiconductor die. In other embodiments, however, the semiconductor die assemblies can include one first semiconductor die stacked on the second semiconductor die. Certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A method of forming a semiconductor die assembly, the method comprising:
   electrically coupling a memory die and a logic die to a package substrate;
   enclosing at least the memory die in a thermally conductive casing, wherein enclosing the memory die includes attaching a sidewall of the thermally conductive casing to a face of the logic die by a thermal adhesive;
   disposing a thermal spacer between the thermally conductive casing and the package substrate; and
   electrically coupling the logic die, the memory die, and the package substrate to the thermal spacer.

2. The method of claim 1, further comprising:
   forming conductive features attached to one or more sides of the thermal spacer; and
   at least partially encapsulating the conductive features in an underfill material.

3. The method of claim 1 wherein the thermal spacer and at least one of the logic die and the memory die are composed of the same semiconductor material.

4. The method of claim 1 wherein the thermal spacer includes silicon.

5. The method of claim 1 wherein the thermal spacer is disposed between the logic die and the package substrate.

6. The method of claim 1, further comprising:
   disposing the thermal spacer in the thermally conductive casing; and
   at least partially encapsulating the thermal spacer and the memory die in an underfill material.

7. The method of claim 1 wherein the thermal spacer is a first thermal spacer, and wherein the method further comprises disposing a second thermal spacer between the memory die and the first thermal spacer.

8. The method of claim 1 wherein the memory die is one of a plurality of memory dies electrically coupled together in a stack.

9. A method of forming a semiconductor die assembly, the method comprising:
   electrically coupling a stack of first semiconductor dies to a plurality of vias extending through a thermal spacer, wherein the thermal spacer includes a semiconductor substrate containing the plurality of vias, and wherein the thermal spacer has a first footprint that extends laterally beyond the stack of first semiconductor dies such that the thermal spacer includes a forward facing surface that is peripheral to the stack of first semiconductor dies;
   attaching the thermal spacer to a second semiconductor die having a second footprint that extends beyond the stack of first semiconductor dies such that the second semiconductor die includes a forward facing surface that is peripheral to the stack of first semiconductor dies, wherein a forward facing surface of the thermal spacer that is peripheral to the stack of first semiconductor dies is vertically aligned with the forward facing surface of the second semiconductor die; and
   attaching a thermally conductive casing to the thermal spacer proximate the forward facing surface of the thermal spacer to at least partially enclose the stack of first semiconductor dies within the thermally conductive casing.

10. The method of claim 9 wherein the method further comprises attaching the second semiconductor die to the thermal spacer such that the thermal spacer is disposed between the second semiconductor die and the stack of first semiconductor dies.

11. The method of claim 9 wherein the stack of first semiconductor dies and the second semiconductor die have different planform shapes.

12. The method of claim 9 wherein the thermal spacer has a different planform shape than the stack of first semiconductor dies.

13. The method of claim 9, further comprising disposing an underfill material within the thermally conductive casing to at least partially encapsulate the stack of first semiconductor dies within the casing.

14. The method of claim 13 wherein attaching the thermally conductive casing further comprises disposing an interface material different than the underfill material between a wall portion of the thermally conductive casing and the forward facing surface of the thermal spacer.

15. The method of claim 9 wherein the second footprint is the same as the first footprint along at least one axis.

16. The method of claim 9 wherein attaching the thermal spacer to the second semiconductor includes disposing a thermal interface material on the forward facing surface of the second semiconductor die.

17. The method of claim 16 wherein the thermal interface material is configured to enhance thermal contact between the second semiconductor die and the thermal spacer.

18. The method of claim 9 wherein the thermally conductive casing includes an outer wall, and wherein the outer wall is vertically aligned with the forward facing surface of the thermal spacer and the forward facing surface of the second semiconductor die.

\* \* \* \* \*